United States Patent [19]

Hayase et al.

[11] Patent Number: 4,975,471

[45] Date of Patent: Dec. 4, 1990

[54] PHOTO-CURABLE EPOXY RESIN TYPE COMPOSITION

[75] Inventors: Shuzi Hayase, Kawasaki; Shuichi Suzuki, Yokohama; Moriyasu Wada, Ninomiya, all of Japan

[73] Assignee: Kabushiki Kaisha Toshiba, Kawasaki, Japan

[21] Appl. No.: 240,378

[22] Filed: Aug. 29, 1988

Related U.S. Application Data

[63] Continuation of Ser. No. 790,122, Oct. 22, 1985, abandoned.

[30] Foreign Application Priority Data

Mar. 29, 1985 [JP] Japan ................................. 60-63913

[51] Int. Cl.$^5$ ................. C08G 59/06; C08G 59/70; C08J 3/28; C08L 63/10
[52] U.S. Cl. ........................................ 522/13; 522/24; 522/25; 522/28; 522/170; 522/167; 522/100; 522/164; 522/166; 522/14; 528/103.5; 528/112; 528/113; 528/124; 528/393
[58] Field of Search .................... 322/13, 14, 18, 24

[56] References Cited

U.S. PATENT DOCUMENTS

| | | | |
|---|---|---|---|
| 3,450,613 | 6/1969 | Steinberg | 522/40 |
| 3,708,296 | 1/1973 | Schlesinger | 96/33 |
| 4,081,276 | 3/1978 | Crivello | 96/35.1 |
| 4,092,443 | 5/1978 | Green | 522/100 |
| 4,252,592 | 2/1981 | Green | 522/100 |
| 4,299,938 | 11/1981 | Green | 522/170 |
| 4,406,764 | 9/1983 | Hayase | 522/29 |
| 4,437,959 | 3/1984 | Hayase | 522/12 |
| 4,479,860 | 10/1984 | Hayase | 522/13 |
| 4,495,042 | 1/1985 | Hayase | 522/28 |

OTHER PUBLICATIONS

Lee et al., "Handbook of Epoxy Resins", McGraw-Hill, 1967, pp. 5-12 and 5-13.
"Hackh's Chemical Dictionary", McGraw-Hill, 1972, Fourth Ed., p. 340.
Journal of Polymer Science; Polymer Chemistry Edition, vol. 17, 2877-2892 (1979) John Wiley & Sons, Inc.

*Primary Examiner*—Marion C. McCamish
*Assistant Examiner*—Arthur H. Koeckert
*Attorney, Agent, or Firm*—Foley & Lardner, Schwartz, Jeffery, Schwaab, Mack, Blumenthal & Evans

[57] ABSTRACT

A photo-curable epoxy resin type composition which comprises (a) an epoxy resin, (b) at least one compound selected from the group consisting of (i) a compound having a group, other than an imido group, which is represented by the formula —CONH and (ii) an aromatic amine, (c) an organic metal compound, where said metal is selected from the group consisting of titanium, vanadium, chromium, manganese, iron, cobalt, nickel, copper, zinc, aluminum and zirconium; and (d) an organic silicon compound having at least one group selected from the group consisting of a peroxysilyl group and an o-nitrobenzyloxy group capable of forming a silanol group by irradiation with light. The photo-curable epoxy resin type composition according to this invention is capable of readily curing by light (ultraviolet ray in particular) and also capable of heat curing at a temperature of 150° C. or more, and yet provides a cured product that is free of ionic impurities, does not corrode metallic materials which may be in contact with the composition, and displays excellent electrical properties.

9 Claims, No Drawings

PHOTO-CURABLE EPOXY RESIN TYPE COMPOSITION

This is continuation of application Ser. No. 790,122, filed Oct. 22, 1985, now abandoned.

BACKGROUND OF THE INVENTION

This invention relates to a photo-curable epoxy resin type composition. More particularly, it relates to a photo-curable epoxy resin type composition capable of giving a cured product which has shortened curing rate and improved curability and has electrical properties suitable for use in insulating materials for electrical equipments and also for use in resist materials.

Recent years, in view of energy saving and improvement of workability, attention has been paid to processes for curing resins by light. Of the processes, a process by which epoxy resins are cured by light has been applied widely and considered important. In the process for effecting photo-curing of the epoxy resins, most important factor is the epoxy resin composition itself, although the conditions for the photo-curing shall not be neglected, and extensive studies have been made on those having a variety of components. The photo-curable epoxy resin compositions having been known in the art can be roughly classified into the following two types.

One is a composition obtained by modification of an epoxy resin with use of a vinyl group-containing compound such as an acrylic acid and its derivatives However, a photo-cured product of the modified epoxy resin has a problem that it is considerably inferior to a cured product of the epoxy resin itself in the heat resisting property.

The other is a composition obtained by adding to the epoxy resin a photodecomposable type catalyst and curing it by use of the catalyst An example of the catalyst used therefor is a complex represented by the following formula:

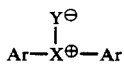

wherein Ar represents a phenyl group, or the like; X represents an iodine atom, a sulfur atom, a diazo group, or the like; and Y represents $BF_4$, $PF_6$, $AsF_6$, $SbF_6$ or the like,
as disclosed in Macromolecules, 10, 1307 (1977); Journal of Radiation Curing, 5, 2 (1978); Journal of Polymer Science Polymer Chemistry Edition, 17, 2877 (1979); ditto, 17, 1047 (1979); Journal of Polymer Science Polymer Letters Edition 17, 759 (1979); Specification of Japanese Unexamined Patent Publication (KOKAI) No. 65219/1980; specification of U.S. Pat. No. 4,069,054; specification of British Patent No. 1,516,511; specification of British Patent No. 1,518,141; etc.

However, when the composition obtained by adding to an epoxy resin the photo-curable type catalyst is used, the resultant photo-cured product has a good mechanical strength and a heat resisting property, whereas the catalyst component tends to remain as an ionic impurity. Therefore, it has problems that the deterioration of electrical properties such as electrical insulating property and corrosion phenomenon in electrical equipments may occur when such a cured product is applied in an electrical equipment.

SUMMARY OF THE INVENTION

It is an object of this invention to provide a photo-curable epoxy resin type composition that can eliminate the above-mentioned problems, being capable of readily curing by light, ultraviolet ray in particular, and also capable of heat-curing even at a temperature of 150° C. or more, and yet provides a cured product that is free of ionic impurities, does not corrode metallic materials used in contact with the composition, and has excellent electrical properties.

The photo-curable epoxy resin type composition according to this invention is characterized in that it comprises;
(a) an epoxy resin;
(b) a compound having at least one group represented by the formula: —NH—;
(c) an organic metal compound; and
(d) an organic silicon compound capable of forming a silanol group by irradiation with light.

DETAILED DESCRIPTION OF THE PREFERRED EMBODIMENTS

The epoxy resin used in this invention is an epoxy compound to be used alone or a mixture of an epoxy compound with one or two or more compounds selected from the group consisting of an acid anhydride, a phenol series compound, a compound having an ethylenic unsaturated group and an imide compound.

As the epoxy compound, there may be mentioned, for example, monofunctional epoxy compounds or polyfunctional epoxy compounds. The monofunctional epoxy compounds may include for example, ethylene oxide, propylene oxide, butylene oxide, styrene oxide, phenyl glycidyl ether, butyl glycidyl ether, etc. The polyfunctional epoxy compounds may include, for example, a bisphenol A type epoxy resin; a bisphenol F type epoxy resin; a phenol-novolac type epoxy resin; an alicyclic epoxy resin; a heterocyclic ring-containing epoxy resin such as triglycidyl isocyanurate, hydantoin epoxy, or the like; a hydrogenated bisphenol A type epoxy resin; an aliphatic epoxy resin such as propylene glycol diglycidyl ether, pentaerythritol polyglycidyl ether or the like; a glycidyl ester type epoxy resin obtained by the reaction of an aromatic, aliphatic or alicyclic carboxylic acid with epichlorohydrin; a spiro ring-containing epoxy resin; a glycidyl ether type epoxy resin which is a reaction product of an o-allyl-phenol-novolac compound and epichlorohydrin; a glycidyl ether type epoxy resin which is a reaction product of a diallyl bisphenol compound, having an allyl group at the o-position of each of the hydroxyl groups in bisphenol A, and epichlorohydrin; etc. One or more kinds selected from the group consisting of the above may be used optionally.

As the phenol series compound to be used by being added to the epoxy compound, there may be mentioned, for example, bisphenol series compounds such as bisphenol A, bisphenol F, bisphenol S and the like; and a condensate of phenols such as phenol, cresol, catechol and bisphenol A with formaldehyde; etc.

As the compound having an ethylenic unsaturated group, there may be mentioned, for example, styrene and derivatives thereof; unsaturated carboxylic acids and unsaturated carboxylates; esters of unsaturated carboxylic acids with aliphatic hydroxyl compounds, aliphatic polyhydroxyl compounds, aromatic hydroxyl compounds or aromatic polyhydroxyl compounds;

polycarboxylic acids containing two or more carboxyl groups; oligoesters obtained by esterification reaction of polyhydroxyl compound containing two or more hydroxyl groups and unsaturated carboxylic acids; etc.

The unsaturated carboxylic acids may include, for example, acrylic acid, methacrylic acid, itaconic acid, crotonic acid, isocrotonic acid, maleic acid, etc.

The aliphatic hydroxyl compounds may include, for example, methanol, ethanol, propanol, butanol, etc.

The aliphatic polyhydroxyl compounds may include, for example, dihydric alcohols such as ethylene glycol, triethylene glycol, tetraethylene glycol, tetramethylene glycol, neopentyl glycol, 1,10-decanediol, 1,2-butanediol, 1,3-butanediol and propylene glycol and a polymer thereof; trihydric alcohols such as trimethylolethane and trimethylolpropane, and a polymer thereof; alcohols containing four or more hydroxyl groups such as pentaerithritol, dipentaerithritol, tripentaerithritol and other polymeric pentaerithritol, saccharides such as sorbitol and D-mannitol; dihydroxycarboxylic acids such as dihydroxymaleic acid, etc.

The aromatic hydroxyl compounds and the aromatic polyhydroxyl compounds may include, for example, phenol, hydroquinone, catechol, resorcinol, phloroglucinol, pyrogallol, etc.

The esters of aliphatic hydroxyl compounds with unsaturated carboxylic acids may include, for example, acrylic esters such as methyl acrylate, ethyl acrylate, n-propyl acrylate, isopropyl acrylate, n-butyl acrylate and tert-butyl acrylate; methacrylic esters such as methyl methacrylate, ethyl methacrylate, n-propyl methacrylate, isopropyl methacrylate, n-butyl methacrylate and tert-butyl methacrylate; itaconic esters such as methyl itaconate, ethyl itaconate, n-propyl itaconate, isopropyl itaconate, n-butyl itaconate and tert-butyl itaconate; crotonic esters such as methyl crotonate, ethyl crotonate, n-propyl crotonate, iso-propyl crotonate, n-butyl crotonate and tert-butyl crotonate; etc.

The esters of aliphatic polyhydroxyl compound and unsaturated carboxylic acid may include, for example, acrylic esters such as ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, tetraethylene glycol diacrylate, pentaerithritol. diacrylate, pentaerithritol triacrylate, pentaerithritol tetraacrylate, dipentaerithritol diacrylate, dipentaerithritol triacrylate, dipentaerithritol tetraacrylate, dipentaerithritol pentaacrylate, dipentaerithritol hexaacrylate, tripentaerithritol octaacrylate, sorbitol triacrylate, sorbitol tetraacrylate, sorbitol pentaacrylate, sorbitol hexaacrylate and polyester acrylate oligomer; methacrylic esters such as tetramethylene glycol dimethacrylate, triethylene glycol dimethacrylate, trimethylolpropane trimethacrylate, trimethylolethane trimethacrylate, pentaerithritol dimethacrylate, pentaerithritol trimethacrylate, dipentaerithritol dimethacrylate, dipentaerithritol tetramethacrylate, tripentaerithritol octamethacrylate, ethylene glycol dimethacrylate, 1,3-butanediol dimethacrylate, tetramethylene glycol dimethacrylate and sorbitol tetramethacrylate; itaconic esters such as ethylene glycol diitaconate, propylene glycol diitaconate, 1,3-butanediol diitaconate, 1,4-butanediol diitaconate, tetramethylene glycol diitaconate, pentaerithritol diitaconate, dipentaerithritol triitaconate, dipentaerithritol pentaitaconate, dipentaerithritol hexaitaconate and sorbitol tetraitaconate; crotonic esters such as ethylene glycol dicrotonate, propylene glycol dicrotonate, tetramethylene glycol dicrotonate, pentaerithritol dicrotonate and sorbitol tetracrotonate; isocrotonic esters such as ethylene glycol diisocrotonate, pentaerithritol diisocrotonate and sorbitol tetraisocrotonate; maleic esters such as ethylene glycol dimaleate, triethylene glycol dimaleate, pentaerithritol dimaleate and sorbitol tetramaleate; and a mixture of some of these esters The oligoesters may include, for example, oligoester acrylate and oligoester methacrylate (hereinafter referred to merely as oligoester(metha)acrylate, thereby representing both or either one of these).

The oligoester(metha)acrylate is a reaction product obtained by esterification reaction of acrylic or methacrylic acid and a polycarboxylic acid with a polyol, and has a chemical structure of the formula:

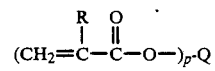

wherein, R represents a hydrogen atom or a methyl group, Q represents a residue having at least one ester bond and being formed by condensation cf the polyol and the polycarboxylic acid, and p is an integer of 1 to 6.

The polyol giving the residue represented by Q may include, for example, polyols such as ethylene glycol, 1,2-propylene glycol, 1,4-butanediol, 1,6-hexanediol, trimethylolpropane, trimethylolethane, 1,2,6-hexanetriol, glycerol, pentaerithritol and sorbitol; polyether type polyols such as diethylene glycol, triethylene glycol, tetraethylene glycol, decaethylene glycol, polyethylene glycol, dipropylene glycol, tripropylene glycol, tetrapropylene glycol and polypropylene glycol, etc.

The polycarboxylic acid giving the residue represented by Q may include, for example, aromatic polycarboxylic acids such as phthalic acid, isophthalic acid, terephthalic acid, tetrachlorophthalic acid, tetrabromophthalic acid, trimellitic acid, pyromellitic acid, benzophenone dicarboxylic acid and resorcinol diacetic acid; unsaturated aliphatic polycarboxylic acids such as maleic acid, fumaric acid, Himic Acid (trademark, produced by Hitachi Chemical Co., Ltd.) and itaconic acid; saturated aliphatic polycarboxylic acid such as malonic acid succinic acid, glutaric acid, adipic acid, pimelic acid, sebacic acid, dodecanoic acid and tetrahydrophthalic acid, etc.

As the acid anhydride which may be used by adding it to the epoxy compound, there may be mentioned, for example, phthalic anhydride, tetrahydrophthalic anhydride, methyltetrahydrophthalic anhydride, hexahydrophthalic anhydride, methylhexahydrophthalic anhydride, maleic anhydride, trimellitic anhydride and hexachloroendomethylenetetrahydrophthalic anhydride.

As the imide compound which may be used by adding it to the epoxy compound, there may be mentioned, for example, maleimides such as maleimide, phenylmaleimide, dimethyl maleimide, etc. Of these, preferred is a maleimide represented by the general formula:

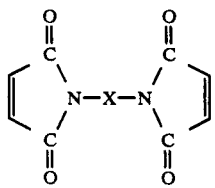

wherein X represents a divalent hydrocarbon such as alkylene group, cycloalkylene group, monocyclic or polycyclic arylene group, or a divalent hydrocarbon bonded through a divalent group such as —CH$_2$—, —CO—, —SO—, —CONH—, etc.

Such a maleimide compound may include, for example, N,N'-phenylenebismaleimide, N,N'-hexamethylenebismaleimide, N,N'-methylene-di-p-phenylenebismaleimide, N,N'-oxy-di-p-phenylenebismaleimide, N,N'-4,4'-benzophenon-bismaleimide, N,N'-(3,3'-dimethyl)-methylene-di-p-phenylenebismaleimide, N,N'-(3,3'-diethyl)-methylene-di-p-phenylenebismaleimide, and N,N'-methatoluilenebismaleimide.

As the compound (b) having at least one imino group to be used in this invention, any of those generally known in the art may be used. It may include, for example, diaminodiphenylmethane, diaminodiphenyl ether diaminobenzanilide, isophphthaloyl bis (4-aminoanilide), N,N'-m-phenylenebis(4-aminobenzamide), isophthaloyl bis(3-aminoanilide) N,O-bis(3-aminobenzoyl-p-aminophenol, bis(4-aminophenyl)isophthalate, ethylenediamine, propylenediamine, xylylenediamine, aniline-formaldehyde resins and polyamide resins. At least one selected from the group consisting of these may be used. Of these, from the viewpoints of storage stability and reactivity, compounds having a group represented by the formula: —CONH— and aromatic amines are preferred.

The mixing proportion of the component (b) is preferably 0.5 to 1.5 equivalent, more preferably, 1 equivalent relative to the component (a). When the mixing proportion is less than 0.5 equivalant, the curing reaction will not proceed sufficiently, and when it exceeds 1.5 equivalent, the characteristics of cured products will not be satisfactory.

The organic metal compound (c) to be used in this invention may be any of those which are metal atoms, and may include, for example, a complex in which an alkoxy group, a substituted or unsubstituted phenoxy group, an acyloxy group, a 8-diketonato group, an o-carbonylphenolato group or the like is bonded to a metal atom such us titanium, vanadium, chromium, manganese, iron, cobalt, nickel, copper, zinc, aluminum and zirconium. Of these, preferred is an organic aluminum compound as it effectively enhances the photo-curing rate.

Of the above organic groups, the alkoxy group may include, for example, a methoxy group, an ethoxy group, an isopropoxy group, a butoxy group, a pentoxy group, etc.; the substituted or unsubstituted phenoxy group may include, for example, a phenoxy group, an o-methylphenoxy group, an o-methoxyphenoxy group, a p-nitrophenoxy group, a 2,6-dimethylphenoxy group, etc; the acyloxy group may include, for example, an acetato group, a propionato group, an isopropionato group, a butylato group, a stearato group, an ethylacetoacetato group, a propylacetoacetato group, an butylacetoacetato group, a diethylmalonato group, a dipivaloylmethanato group, etc.; the β-diketonato group may include, for example, an acetylacetonato group, a trifluoroacetylacetonato group, a hexafluoroacetylacetonato group,

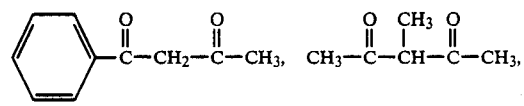

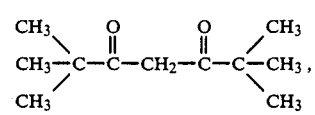

etc.; and the o-carbonylphenolato group may include, for example, a salicylaldehydato group, etc.

More specifically, the organic aluminum compounds mentioned above may include, for example, trismethoxyaluminum, trisethoxyaluminum, trisisopropoxyaluminum, trisphenoxyaluminum, trisparamethylphenoxyaluminum, isopropoxydiethoxyaluminum, tris-'buthoxyaluminum, trisacetoxyaluminum, trisstearatoaluminum, trisbutylatoaluminum, trispropionatoaluminum, trisisopropionatoaluminum, trisacetylacetonatoaluminum, tristrifluoroacetylacetonatoaluminum, trishexafluoroacetylacetonatoaluminum, trisethylacetoacetatoaluminum, tris(n-propylacetoacetato)aluminum, tris(iso-propylacetoacetato)aluminum, tris(n-butylacetoacetato)aluminum, trissalycilaldehydatoaluminum, trisdiethylmalonatoaluminum, trispropylacetoacetatoaluminum, trisbutylacetoacetatoaluminum, trisdipivaloylmethanatoaluminum, diacetylacetonatodipivaloylmethanatoaluminum,

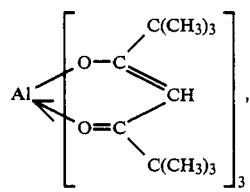

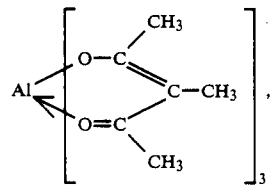

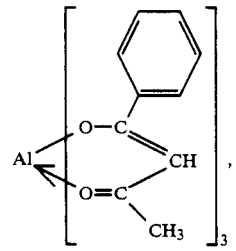

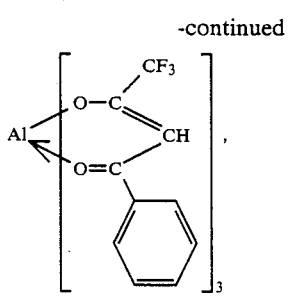

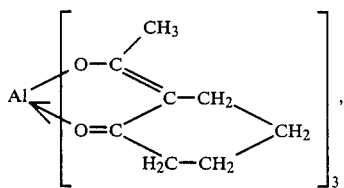

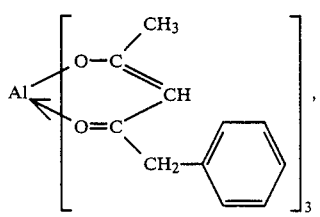

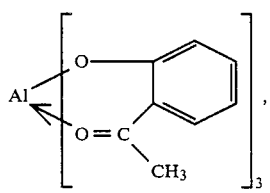

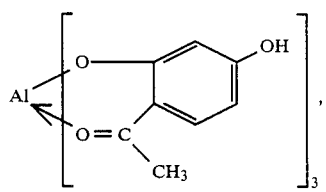

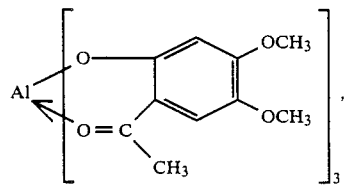

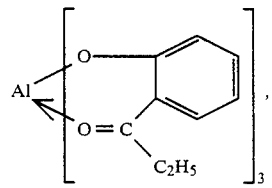

etc. At least one selected from the group consisting of these may be used.

The mixing proportion of the component (c) is preferably 0.001 to 10% by weight, more preferably, 0.05 to 5% by weight relative to the component (a). When the mixing proportion is less than 0.001% by weight, sufficient curability of the product will not be obtained; when it exceeds 10% by weight, a high cost of production and a poor electrical property of the product will be caused.

The organic silicon compound (d) to be used in this invention may be any of those which is capable of forming a silanol group by irradiation with light, and it may include, for example, a compound having a peroxysilyl group or an o-nitrobenzyloxy group.

The organic silicon compound having a peroxysilyl group is represented by the following formula:

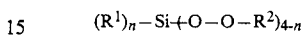

wherein $R^1$ represents a hydrogen atom, a halogen atom, an alkyl group having 1 to 5 carbon atoms, an alkoxy group having 1 to 5 carbon atoms or an aryl group; $R^2$ represents a hydrogen atom, an alkyl group having 1 to 10 carbon atoms or an aryl group; and n is an integer of 0 to 3.

In the above formula, the alkyl group having 1 to 5 carbon atoms may include, for example, a methyl group, an ethyl group, an n-propyl group, isopropyl group, an n-butyl group, a t-butyl group, a sec-butyl group, an n-pentyl group, etc.; the alkoxy group having 1 to 5 carbon atoms may include, for example, a methoxy group, an ethoxy group, an n-propoxy group, an isopropoxy group, an n-butoxy group, a t-butoxy group, a sec-butoxy group, an n-pentoxy group, etc.; the aryl group may include, for example, a phenyl group, a naphthyl group, an anthranil group, a benzyl group, an α,α-dimethylbenzyl group, a 1,2,3,4-tetrahydro-1-naphthyl group etc; the alkyl group having 1 to 10 carbon atoms and the aryl group may have a substituent or substituents such as a halogen atom, a nitro group, a cyano group or a methoxy group. More specifically, the silicon compound having the peroxysilyl group may include, for example, compounds of the following formulae:

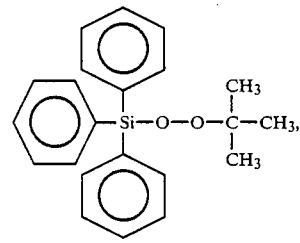

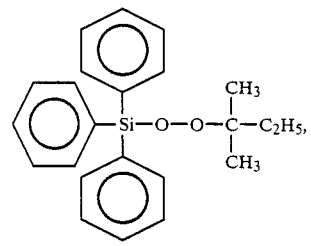

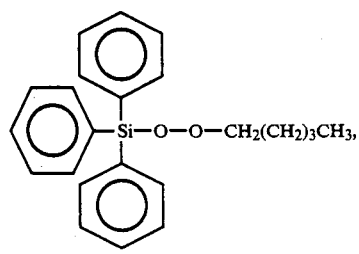
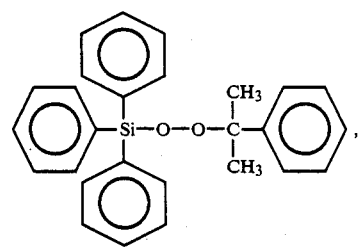
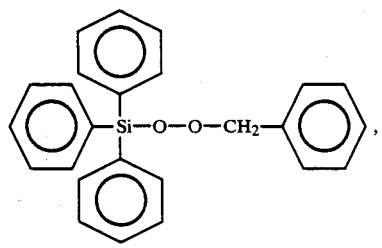
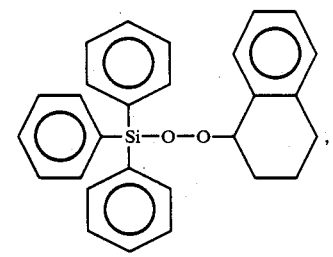
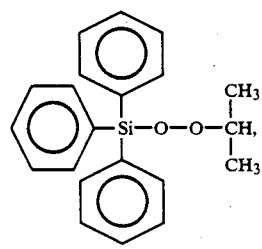
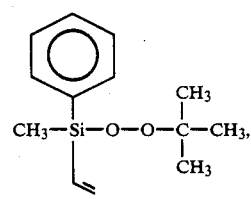
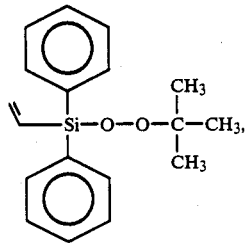
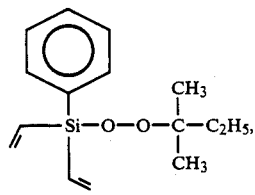
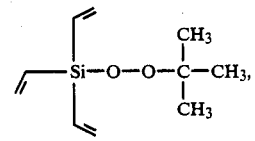
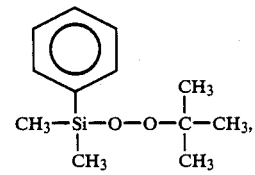
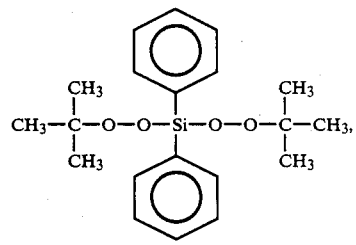
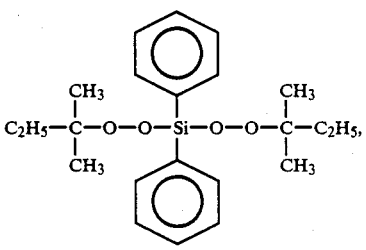
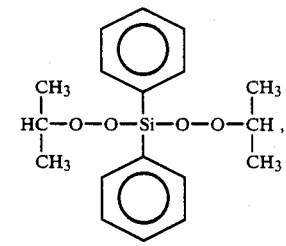

-continued

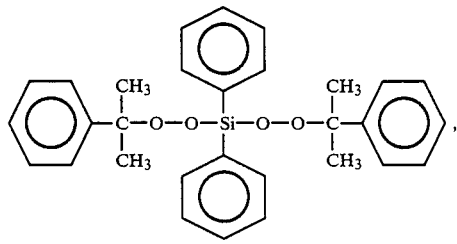

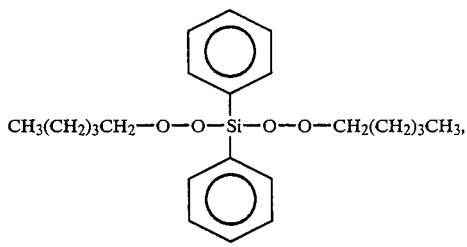

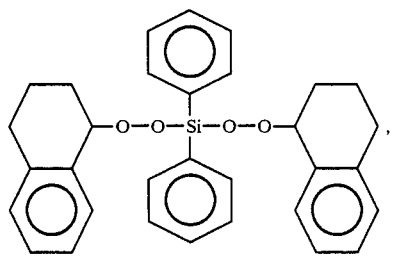

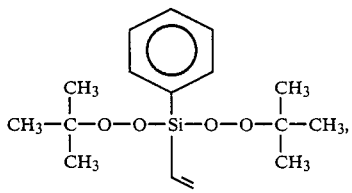

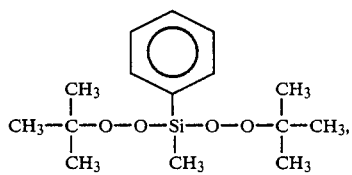

etc.

The silicon compound having an o-nitrobenzyloxy group is represented by the following formula:

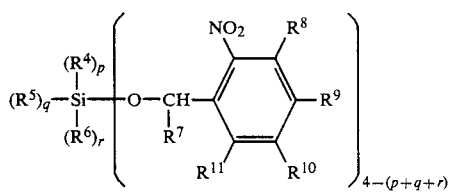

wherein $R^4$, $R^5$ and $R^6$ may be same or different and each represent a hydrogen atom, a halogen atom, a vinyl group, an allyl group, a substituted or unsubstituted alkyl group having 1 to 10 carbon atoms, an alkoxy group having 1 to 10 carbon atoms, a substituted or unsubstituted aryl group, an aryloxy group or a siloxy group; $R^7$ represents a hydrogen atom, a substituted or unsubstituted alkyl group having 1 to 10 carbon atoms, a phenyl group or a substituted phenyl group; $R^8$, $R^9$, $R^{10}$ and $R^{11}$ may be same or different and each represent a hydrogen atom, a nitro group, a cyano group, a hydroxyl group, a mercapto group, a halogen atom, an acetyl group, an allyl group, an alkyl group having 1 to 5 carbon atoms, an alkoxy group having 1 to 5 carbon atoms, a substituted or unsubstituted aryl group or an aryloxy group; and p, q and r are integers satisfying the conditions of $0<p$, q, $r<3$ and $1<p+q+r<3$.

Of the above formula, the halogen atom may include, for example, a chlorine atom, a bromine atom, etc.; the substituted or unsubstituted alkyl group having 1 to 10 carbon atoms (or 1 to 5 carbon atoms) may include, for example, a methyl group, an ethyl group, an n-propyl group, an n-butyl group, a t-butyl group, a chloromethyl group, a chloroethyl group, a fluoromethyl group, cyanomethyl group, etc.; the alkoxy group having 1 to 10 carbon atoms (or 1 to 5 carbon atoms) may include, for example, a methoxy group, an ethoxy group, n-propoxy group, n-butyl group, etc.; the substituted or unsubstituted aryl group may include, for example, a phenyl group, a p-methoxyphenyl group, a p-chlorophenyl group, a p-trifluoromethylphenyl group, etc.; and the aryloxy group may include, for example, a phenoxy group, etc.

Alternatively, the organic silicon compound may be a compound comprising as a terminal group an o-nitrobenzyloxysilyl group and as a principal chain a group represented by the formula:

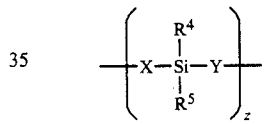

wherein z is an integer of 0 or more; $R^4$ and $R^5$ are as defined in the foregoing; X and Y may be same or different and each represent an oxygen atom, an alkylene group, an aryl group, etc.

The organic silicon compound having the substituted or unsubstituted o-nitrobenzyloxy group bonded directly to a silicon atom may include the following compounds;

(1) trimethyl(o-nitrobenzyloxy)silane,
(2) dimethylphenyl(o-nitrobenzyloxy)silane,
(3) diphenylmethyl(o-nitrobenzyloxy)silane,
(4) triphenyl(o-nitrobenzyloxy)silane,
(5) vinylmethylphenyl(o-nitrobenzyloxy)silane,
(6) t-butylmethylphenyl(o-nitrobenzyloxy)silane,
(7) triethyl(o-nitrobenzyloxy)silane,
(8) tri(2-chloroethyl)-o-nitrobenzyloxysilane,
(9) tri(p-trifluoromethylphenyl)-o-nitrobenzyloxysilane,
(10) trimethyl[α-(o-nitrophenyl)-o-nitrobenzyloxy]silane,
(11) dimethylphenyl[α-(o-nitrophenyl)-o-nitrobenzyloxy]silane,
(12) methylphenyldi[α-(o-nitropeenyl)-o-nitrobenzyloxy]silane,
(13) triphenyl(o-ethyl-o-nitrobenzyloxy)silane,
(14) trimethyl(3-methyl-2-nitrobenzyloxy)silane,
(15) dimethylphenyl(3,4,5-trimethoxy-2-nitrobenzyloxy)silane,
(16) triphenyl(4,5,6-trimethoxy-2-nitrobenzyloxy)silane,

(17) diphenylmethyl(5-methyl-4-methoxy-2-nitrobenzyloxy)silane,
(18) triphenyl(4,5-dimethyl-2-nitrobenzyloxy)silane,
(19) vinylmethylphenyl(4,5-dichloro-2-nitrobenzyloxy)silane,
(20) triphenyl(2,6-dinitrobenzyloxy)silane,
(21) diphenylmethyl(2,4-dinitrobenzyloxy)silane,
(22) triphenyl(3-methoxy-2-nitrobenzyloxy)silane,
(23) vinylmethylphenyl(3,4-dimethoxy-2-nitrobenzyloxy)silane,
(24) dimethyldi((o-nitrobenzyloxy)silane,
(25) methylphenyldi(o-nitrobenzyloxy)silane,
(26) vinylphenyldi(o-nitrobenzyloxy)silane,
(27) t-butylphenyldi(o-nitrobenzyloxy)silane,
(28) diethyldi(o-nitrobenzyloxy)silane,
(29) 2-chloroethylphenyldi(o-nitrobenzyloxy)silane,
(30) diphenyldi(o-nitrobenzyloxy)silane,
(31) diphenyldi(3-methoxy-2-nitrobenzyloxy)silane,
(32) diphenyldi(3,4-dimethoxy-2-nitrobenzyloxy)silane,
(33) diphenyldi(2,6-dinitrobenzyloxy)silane,
(34) diphenyldi(2,4-dinitrobenzyloxy)silane,
(35) methyltri(o-nitrobenzyloxy)silane,
(36) phenyltri(o-nitrobenzyloxy)silane,
(37) p-bis(o-nitrobenzyloxydimethylsilyl)benzene,
(38) 1,1,3,3-tetraphenyl-1,3-di(o-nitrobenzyloxy)siloxane,
(39) 1,1,3,3,5,5-hexaphenyl-1,5-di(o-nitrobenzyloxy)siloxane, and
(40) a silicon compound formed by reaction of SiCl-containing silicone resin and o-nitrobenzylalcohol.

The organic silicon compounds as exemplified above which is the component (d) of this invention may be used alone or in combination of two or more kinds.

The mixing proportion of this component (d) is preferably in the range of from 0.01 to 20 % by weight, more preferably, 1 to 10 % by weight, relative to the component (a). When the amount mixed is less than 0.01% by weight, sufficient curability of the product will not be obtained, and, on the other hand, when it exceeds 20% by weight, a high cost of production and a decomposition product of catalytic component may cause problems.

Into the photo-curable epoxy resin type composition of this invention, a photosensitizer, a filler, a surface treatment agent, a lubricant, etc. may further be mixed optionally. The photosensitizer may be any of those which are capable of photosensitizing the foregoing compounds, and which are selected depending on the kinds of the epoxy resins, light source, etc.

The above photosensitizers may include, for example, aromatic hydrocarbons, benzophenone and derivatives thereof, esters of o-benzoylbenzoic acids, acetophenone and derivatives thereof, benzoin and benzoin ethers and derivatives thereof, xanthone and derivatives thereof, thioxanthone and derivatives thereof, disulfide compounds, quinone compounds, halogenated hydrocarbons, amines, etc.

Typical examples of the aromatic hydrocarbon are benzene, benzene-$d_6$, toluene, p-xylene, fluorobenzene, chlorobenzene, bromobenzene, iodobenzene, naphthalene, 1-methylnaphthalene, 2-methylnaphthalene, 1-fluoronaphthalene, 1-chloronaphthalene, 2-chloronaphthalene, 1-bromonaphthalene, 2-bromonaphthalene, 1-iodonaphthalene, 2-iodonaphthalene, 1-naphthol, 2-naphthol, biphenyl, fluorene, p-terphenyl, acenaphthene, p-quaterphenyl, triphenylene, phenanthrene, azulene, fluoranthene, chrycene, pyrene, 1,2-benzpyrene, anthracene, 1,2-benzanthracene, 9,10-dichloroanthracene, 9,10-dibromoanthracene, 9,10-diphenylanthracene, perylene, tetracene, pentacene, benzyl, etc.

The benzophenone and the derivatives thereof may include, for example, benzophenone, 2,4-dimethylbenzophenone, 2,4-dichlorobenzophenone, 4,4'-bis(dimethylamino)benzophenone, etc.

The esters of o-benzoylbenzoic acids may include, for example, methyl o-benzoylbenzoate, ethyl o-benzoylbenzoate, phenyl o-benzoylbenzoate,

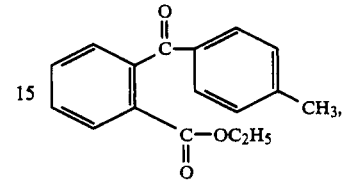

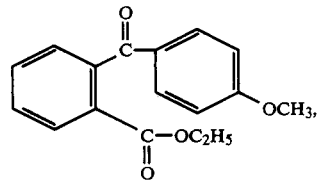

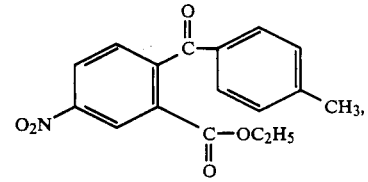

etc.

The acetophenone and the derivatives thereof may include, for example, acetophenone, 4-methylacetophenone, 3-methylacetophenone, 3-methoxyacetophenone, etc.

The benzoin, the benzoin ethers and the derivatives of these may include, for example, benzoin, benzoin methyl ether, benzoin ethyl ether, benzoin isopropyl ether, benzoin n-butyl ether, benzoin triphenylsilyl ether,

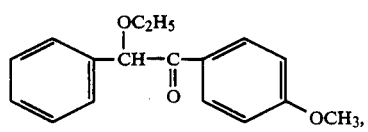

etc.

The xanthone and the derivatives thereof may include, for example, xanthone, 2,4-dimethylxanthone, 2,4-dichloroxanthone, etc.

The thioxanthone and the derivatives thereof may include, for example, thioxanthone, 2,4-dimethylthioxanthone, 2,4-dichlorothioxanethone, etc.

The disulfide compounds may include, for example,;

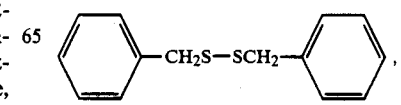

-continued
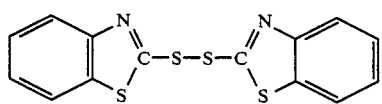
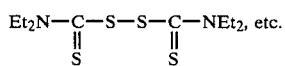
The quinone series compounds may include, for example, benzoquinone, naphthoquinone, anthraquinone, 5,12-naphthacene dione, 2,7-pyrene dione, etc.
The halogenated hydrocarbons may include, for example, carbon tetrachloride, hexachloroethane, carbon tetrabromide,
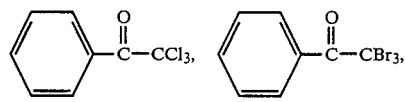
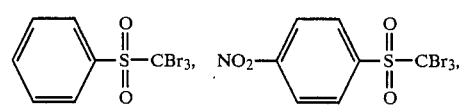
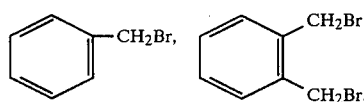
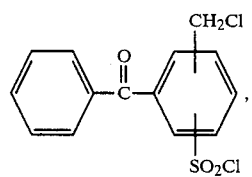
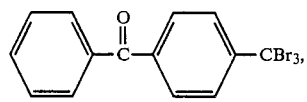
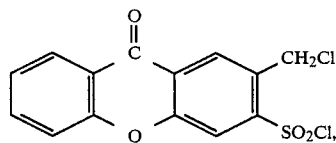
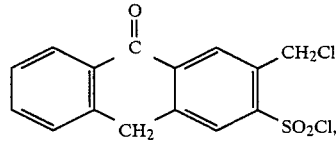
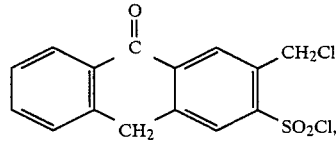
-continued
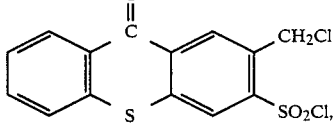
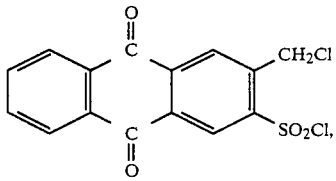
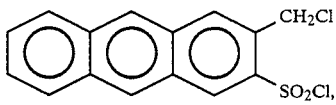
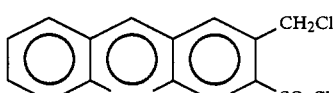
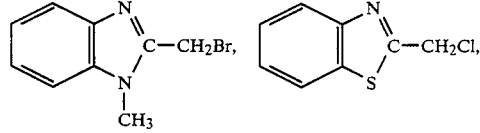
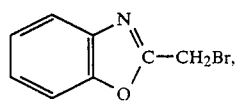
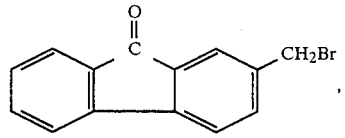
etc.
The amines may include, for example, diphenylamine, carbazole, triphenylamine,
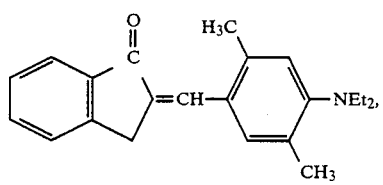
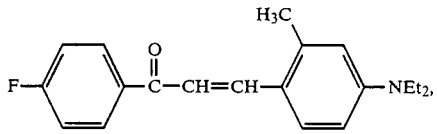
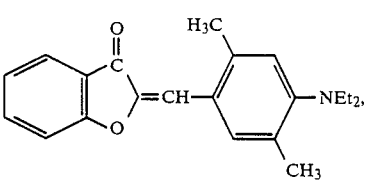

-continued

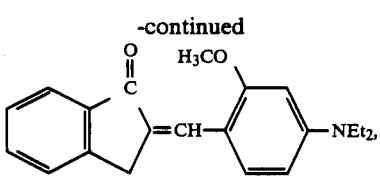

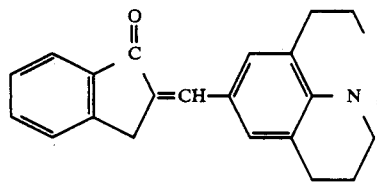

etc.

The other photosensitizers may include, for example, propiophenone, anthrone, benzaldehyde, butylophenone, 2-naphthylphenylketone, 2-naphthaldehyde, 2-acetonaphthone, 1-naphthylphenylketone, 1-acetonaphthone, 1-naphthoaldehyde, fluorenone, 1-phenyl-1,2-propane dione, benzonitorile, acetone, biacetyl, acridine orange, acridine, Rhodamine-B, eosine, fluorescein,

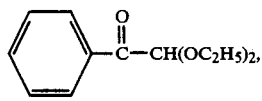

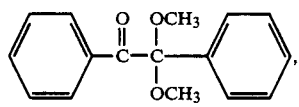

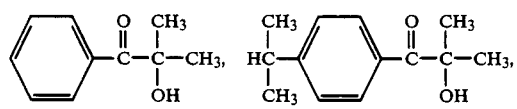

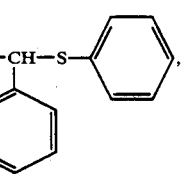

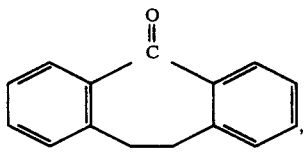

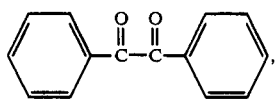

etc.

The photosensitizers exemplified in the above may be used alone or in combination, and should be mixed preferably in an amount of from 0.001 to 10 % by weight, more preferably 0.01 to 5 % by weight, based on the epoxy resin which is the component (a).

As the filler, there may be used those which are generally known in the art, such as fused silica, crystalline silica, glass fiber, talc, alumina, calcium silicate, calcium carbonate, barium sulfate and magnesia In particular, when a glassy filler such as glass fiber is used, transparency of light becomes satisfactory with the desirable results.

These fillers may be used alone or in combination of two or more ones. The mixing proportion thereof is preferably 1 to 200 % by weight, more preferably 20 to 50 % by weight, relative to the epoxy resin which is the component (a).

The photo-curable epoxy resin type composition according to this invention can be readily prepared by, for instance, mixing and stirring the above-mentioned components by means of a mixing machine such as Henschel mixer, followed by kneading the mixture with use of a heating roll, a heating kneader, a heating extruder and so on.

In use of the photo-curable epoxy resin type composition according to this invention, it is placed into a practical use by a method such as room temperature photo-curing, heating photo-curing, and postcuring after photo-curing.

The wavelength necessary for the photo-curing varies depending on the components of the resin composition, but, in general, it ranges from 180 to 700 nm, preferably from 250 to 500nm Light irradiation time also varies depending on the composition of epoxy resins and the kind of catalysts In general, it ranges from 10 seconds to 180 minutes, preferably 30 seconds to 30 minutes In the case of the heating photo-curing, the heating temperature may vary depending on the composition of epoxy resins and the kind of catalysts, but in general it ranges from 20° to 200° C., preferably, 150° to 200° C., particularly preferably 160° to 170° C. As the light source for the light irradiation, it is possible to use a high pressure mercury-vapor lamp, a carbon arc lamp, a xenon lamp, an argon glow discharge lamp, a metal halide lamp, etc. The postcuring after photo-curing is preferably carried out at 50° to 200° C., preferably, 100° to 180° C., for 1 to 10 hours, preferably, 2 to 5 hours in general, while varing with the composition and kind of the epoxy resins.

This invention will be described in greater detail by giving the following Examples:

Synthesis of a modified acrylic acid epoxy resin (AE-1)

Into a four neck flask equipped with a thermometer, a reflux device, an N2 gas inlet and a stirrer, 210 g of ERL-4260 (trademark; produced by Union Carbide Corp.; vinylcyclohexanediepoxide; epoxy equivalent: 70), 117 g of acrylic acid, 400 g of toluene, 0.001 g of hydroquinone and, as a catalyst, 1.56 g of choline chloride were introduced, followed by gradual temperature elevation with stirring to carry out reaction at a temperature at which the toluene was refluxed. Proceeding of the reaction was followed up to measure the consumed amount of the acrylic acid by the oxidation measurement using an aqueous solution of 0.1N standard NaOH, until the reaction was completed at the stage where the oxidation reached substantially zero. After completion of the reaction, the reaction liquid was mixed with 1 litre of ion exchange water to carry out washing three times, followed by separation of toluene by means of a separating funnel, and then distilling away the toluene under reduced pressure Resultant AE-1 thus synthesized was found to have viscosity of 25 poise (25° C.) and epoxy equivalent of 94.

EXAMPLES 1 to 15

Fifteen kinds of photo-curable epoxy resin type compositions each having the composition as shown in Table 1 (in % by weight) were prepared.

Employed as epoxy compounds were ERL-4221 (trademark, produced by Union Carbide Corp., an alicyclic epoxy resin, epoxy equivalent: 145), Chissonox 206 (trademark, produced by Chisso Corporation, molecular formula (1)), Chissonox 234 (trademark, produced by Chisso Corporation, an alicyclic epoxy resin of the molecular formula (2), epoxy equivalent: about 140), Epikote 828 (trademark, produced by Shell International Chemicals Corp., a bisphenol-A type epoxy resin, epoxy equivalent: 190 to 210, molecular weight: 380), Epikote 1001 (tradename, ditto, epoxy equivalent: 450 to 525, molecular weight: 900), Epikote 1004 (trademark, ditto, epoxy equivalent: 900 to 1000, molcular weight: about 1000) and the aforementioned AE-1.

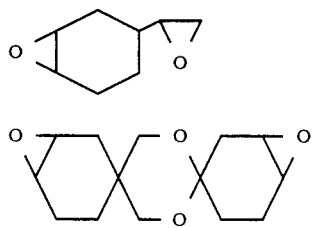

As phenol series compounds, employed were bisphenol A and catechol.

As ethylenic compounds, employed were (1) trimethylolpropane triacrylate and (2) pentaerithritol dimethacrylate.

As acid anhydrides, employed were (3) Epicron B-570 (trademark, produced by Dainippon Ink and Chemicals, Incorporated; methyl-$\Delta$4-tetrahydrophthalic anhydride) and (4) Rikacid MH-700 (trademark, New Japan Chemical Co., Ltd.; methylhexahydrophthalic anhydride)

As imide compounds, employed were (5) N,N'-phenylenebismaleimide and (6) N,N'-4,4'-benzophenonebismaleimide.

As aluminum compounds, employed were;
(i) trisacetylacetonatoaluminum,
(ii) tris(n-butylacetylacetato)aluminum, and
(iii) trissalicylaldehydatoaluminum.
(iv) tris(ethylacetoacetato)aluminum As silicon compounds, employed were;
(a) triphenyl(t-butylperoxy)silane
(b) triphenyl($\alpha,\alpha'$-dimethylbenzylperoxy)silane,
(c) triphenylsilylorthonitrobenzil ether, and
(d) diphenyl($\alpha,\alpha'$-dimethylbenzylperoxy)silane. As sensitizers, employed were (A) naphthacene, (B) benzophenone, (C) benzoin isopropyl ether and (D) 2,4-dimethylthioxanthone.

As fillers, employed were (p) milled fiber (produced by Asahi Fiber Glass Co.), (q) 5× (trademark, crystalline silica, produced by Ryushinsha Co.) and (r) GR80 (trademark, fused silica, produced by Toshiba Ceramics Co.).

Each of the above photo-curable epoxy resin type compositons were applied by coating on an aluminum plate, which was passed, at the rate of 1m/min, through a curing box equipped with three sets of 2 kW high pressure mercury lamps H2000L/81N (produced by Toshiba Corporation) to carry out UV-curing.

Values for tan $\delta$ of the respective cured products were measured. Results are shown together in Table 1.

TABLE 1

| Components et al. | Example No. (% by weight) | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| Epoxy resins: | | | | | | | | | | | | | | | |
| ERL-4221 | 10 | — | — | — | — | — | — | — | — | — | — | — | — | 20 | — |
| Chissonox 206 | — | 10 | — | — | — | — | — | — | — | — | — | — | — | — | — |
| Chissonox 234 | — | — | 10 | — | — | — | — | — | — | — | — | — | — | — | — |
| Epikote 828 | 60 | 60 | 60 | 80 | 80 | 80 | 50 | 50 | 50 | 50 | 50 | 80 | 80 | 80 | 80 |
| Epikote 1001 | 20 | — | 20 | 20 | 20 | 20 | 50 | 50 | 50 | 50 | 50 | — | 20 | — | 20 |
| Epikote 1004 | — | 20 | — | — | — | — | — | — | — | — | — | 20 | — | — | — |
| Bisphenol A | — | — | 10 | — | — | — | — | — | — | — | — | — | — | — | — |
| Catechol | — | — | — | 10 | — | — | — | — | — | — | — | — | — | — | — |
| Ethylenic compound (1) | — | — | — | — | — | 10 | — | — | — | — | — | — | — | — | — |
| Ethylenic compound (2) | — | — | — | — | — | — | 10 | — | — | — | — | — | — | — | — |
| Acid anhydride (3) | — | — | — | — | — | — | — | 10 | — | — | — | — | — | — | — |
| Acid anhydride (4) | — | — | — | — | — | — | — | — | 10 | — | — | — | — | — | — |
| Imide compound (5) | 10 | — | — | — | — | — | — | — | — | 10 | — | — | — | — | — |
| Imide compound (6) | — | 10 | — | — | — | — | — | — | — | — | 5 | — | — | — | — |
| AE-1 | — | — | — | — | — | — | — | — | — | — | — | 20 | — | — | — |
| Compound having imino group: | | | | | | | | | | | | | | | |
| 4,4'-diaminodiphenyl-methane | 15 | — | 15 | 20 | — | 20 | 20 | 20 | 20 | 20 | 20 | 20 | 20 | — | 20 |
| 4,4'-diaminodiphenyl ether | — | 15 | — | — | 15 | — | — | — | — | — | — | — | — | 20 | — |
| Aluminum compounds: | | | | | | | | | | | | | | | |
| (i) | 2 | — | — | — | 2 | 2 | — | — | — | — | — | — | — | — | — |
| (ii) | — | 2 | — | — | — | — | 2 | 2 | 2 | 2 | 2 | 2 | 2 | 2 | 2 |
| (iii) | — | — | 2 | — | — | — | — | — | — | — | — | — | — | — | — |

TABLE 1-continued

| Components et al. | Example No. | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| (iv) | — | — | — | 2 | — | — | — | — | — | — | — | — | — | — | — |
| Silicon compounds: | | | | | | | | | | | | | | | |
| (a) | 4 | — | — | — | 4 | 4 | 4 | 4 | 4 | 4 | 4 | 4 | 4 | 4 | 4 |
| (b) | — | 4 | — | — | — | — | — | — | — | — | — | — | — | — | — |
| Silicon compounds: | | | | | | | | | | | | | | | |
| (c) | — | — | 4 | — | — | — | — | — | — | — | — | — | — | — | — |
| (d) | — | — | — | 4 | — | — | — | — | — | — | — | — | — | — | — |
| Photosensitizer: | | | | | | | | | | | | | | | |
| (A) | 1 | — | — | — | — | — | — | — | — | — | — | — | — | — | — |
| (B) | — | 1 | — | — | — | 1 | 1 | 1 | 1 | 1 | 1 | 1 | 1 | 1 | 1 |
| (C) | — | — | — | — | 1 | — | — | — | — | — | — | — | — | — | — |
| (D) | — | — | — | 1 | — | — | — | — | — | — | — | — | — | — | — |
| Filler: | | | | | | | | | | | | | | | |
| (p) | — | — | — | — | — | — | — | — | — | — | — | — | 50 | 50 | — |
| (q) | — | — | — | — | — | — | — | — | — | — | — | — | 50 | — | — |
| (r) | — | — | — | — | — | — | — | — | — | — | — | — | — | 50 | 50 |
| results of measurements: tan δ(16° C.) | 1.2 | 1.1 | 3.2 | 2.9 | 2.5 | 2.8 | 2.5 | 3.7 | 3.9 | 1.9 | 1.8 | 3.2 | 5.9 | 6.5 | 5.3 |

COMPARATIVE EXAMPLES 1 to 4

Four kinds of photo-curable epoxy resin compositions each having the composition shown in Table 2 were prepared and applied by coating on aluminum plate respectively in the same manner as in Example 1 to 15. The obtained cured products were measured with its value for tan δ. Results are shown together in Table 2.

TABLE 2

| Components et al. | Comparative Example No. | | | |
|---|---|---|---|---|
| | 1 | 2 | 3 | 4 |
| Epoxy resins: | | | | |
| ERL-4221 | 10 | — | 10 | 10 |
| Chissonox 206 | — | 10 | — | — |
| Chissonox 234 | — | — | — | — |
| Epikote 828 | 60 | 60 | 60 | 60 |
| Epikote 1001 | 20 | — | 20 | 20 |
| Epikote 1004 | — | 20 | — | — |
| Bisphenol A | — | — | — | — |
| Catechol | — | — | — | — |
| Ethylenic compound (1) | — | — | — | — |
| Ethylenic compound (2) | — | — | — | — |
| Acid anhydride (3) | — | — | — | — |
| Acid anhydride (4) | — | — | — | — |
| Imide compound (5) | — | — | — | — |
| Imide compound (6) | — | — | — | — |
| AE-1 | — | — | — | — |
| Compound having imino group: | | | | |
| 4,4'-diaminodiphenyl methane | — | — | 15 | 15 |
| 4,4'-diaminodiphenyl ether | — | — | — | — |
| Aluminum compounds: | | | | |
| (i) | — | — | — | — |
| (ii) | 2 | 2 | 2 | — |
| (iii) | — | — | — | — |
| (iv) | — | — | — | — |
| Silicon compounds: | | | | |
| (a) | 4 | 4 | — | 4 |
| (b) | — | — | — | — |
| (c) | — | — | — | — |
| (d) | — | — | — | — |
| Photosensitizer: | | | | |
| (A) | — | — | — | — |
| (B) | 1 | 1 | 1 | 1 |
| (C) | — | — | — | — |
| (D) | — | — | — | — |
| Filler: | | | | |
| (p) | — | — | — | — |
| (q) | — | — | — | — |
| (r) | — | — | — | — |
| results of measurements tan δ(16° C.) | *1 | *1 | *1 | *1 |

*1: not cured

EXAMPLES 16 to 18

Three kinds of photo-curable epoxy resin type compositions having the composition shown in Table 3 were prepared. These compositions were applied by coating on aluminum plates respectively and UV curing was carried out by use of 80W/cm high pressure mercury lamp from the distance of 15 cm to examine the curing time. The curing time was determined by the time until the epoxy resin type compositions became tack-free The results are shown in Table 3.

COMPARATIVE EXAMPLE 5

A photo-curable epoxy resin composition having the composition shown in Table 3 was prepared and the same test as in the Examples 16 to 18 was carried out. The result obtained is shown also in Table 3.

TABLE 3

| Components et at. | Example | | | Comparative Example No. |
|---|---|---|---|---|
| | 16 | 17 | 18 | 5 |
| Epoxy resin: | | | | |
| Epikote 828 | 100 | 100 | 100 | 100 |
| Compound having imino group: | | | | |

TABLE 3-continued

| Components et at. | Example | | | (% by weight) Comparative Example No. |
|---|---|---|---|---|
| | 16 | 17 | 18 | 5 |
| 4,4'-diamino-diphenyl methane | 15 | — | — | — |
| 4,4'-diamino-diphenyl ether | — | 15 | — | — |
| 4,4'-diamino-diphenyl sulphone | — | — | 15 | — |
| Silicone compounds: | | | | |
| triphenyl (t-butyl peroxy silane | 4 | 4 | 4 | 4 |
| Aluminum compounds: | | | | |
| tris n-butylacetyl acetato aluminum | 2 | 2 | 2 | 2 |
| Sensitizer: | | | | |
| benzophenone | 1 | 1 | 1 | 1 |
| Curing time: | 1 min | 1.5 min | 3 min | *2 |

*2 not cured in 3 minutes

As described in detail in the foregoing, the photo-curable epoxy resin type composition according to this invention is capable of readily curing by light (ultraviolet ray in particular) and is also capable of heat-curing at a temperature of 150° C. or more, and yet provides a cured product that is free of ionic impurities, does not corrode metallic materials which may be in contact with the composition, and has excellent electrical properties. Thus, this invention has a very great industrial values.

We claim:

1. A photo-curable composition which comprises
   (a) an epoxy resin;
   (b) an aromatic amine that has at least one —NH group;
   (c) an organic aluminum compound selected from the group consisting of alkoxyaluminum, substituted or unsubstituted phenoxyaluminum, acyloxyaluminum, β-diketonatoaluminum and carbonylphenolatoaluminum compounds; and
   (d) an organic silicon compound that has at least one substituent selected from a peroxysilyl group and an o-nitrobenzyloxy group and that is capable of forming a silanol group upon irradiation with light.

2. The photo-curable composition according to claim 1, wherein the composition further comprises a filler.

3. The photo-curable composition according to claim 1, wherein the mixing proportion of the component (b) is 0.5 to 1.5 equivalent based on component (a).

4. The photo-curable composition according to claim 1, wherein the mixing proportion of component (c) is 0.001 to 10% by weight based on the component (a).

5. The photo-curable composition according to claim 1, wherein the mixing proportion of component (d) is 0.01 to 20% by weight based on component (a).

6. The photo-curable composition according to claim 2, wherein the mixing proportion of the filler is 1 to 200% by weight of component (a).

7. The photo-curable epoxy resin type composition according to claim 1, wherein component (b) is selected from the group consisting of diaminodiphenylmethane, diaminodiphenyl ether, diaminobenzanilide, isophthaloyl bis(4-aminoanilide), N,N'-m-phenylene-bis(4-aminobenzamide), isophthaloyl bis(3-aminoanilide) N,Obis(3-aminobenzoyl-p-aminophenol, bis(4-aminophenyl)isophthalate an aniline-formaldehyde resin and a polyamide resin.

8. The photo-curable composition according to claim 1, further comprising a compound selected from the group consisting of biacetyl, acetophenone, benzophenone, benzil, benzoin, benzoin isobutyl ether, benzil dimethyl ketal, benzoyl peroxide, 1-hydroxycyclohexylphenyl ketone, (1-hydroxy-1-methylethyl)-phenyl ketone, p-isopropyl-2-hydroxyisobutylphenone, thioxanthone, chlorothioxanthone, 4,4'-diethylamino benzophenone, 4,4'-dimethylamino benzophenone.

9. The photo-curable composition according to claim 8, wherein the mixing proportion of the photosensitizer is 0.001 to 10% by weight based on component (a).

* * * * *